(12) United States Patent
Heightley

(10) Patent No.: US 6,445,621 B1
(45) Date of Patent: Sep. 3, 2002

(54) DYNAMIC DATA AMPLIFIER WITH BUILT-IN VOLTAGE LEVEL SHIFTING

(75) Inventor: John D. Heightley, Colorado Springs, CO (US)

(73) Assignee: Mosel Vitelic, Inc., Hsinchu (TW)

( * ) Notice: Subject to any disclaimer, the term of this patent is extended or adjusted under 35 U.S.C. 154(b) by 0 days.

(21) Appl. No.: 09/547,384

(22) Filed: Apr. 11, 2000

Related U.S. Application Data

(60) Provisional application No. 60/177,548, filed on Jan. 21, 2000.

(51) Int. Cl.[7] .................................................. G11C 7/00
(52) U.S. Cl. .................................. 365/189.11; 365/203
(58) Field of Search ...................... 365/189.05, 189.11, 365/190, 203, 226, 205

(56) References Cited

U.S. PATENT DOCUMENTS

| | | | |
|---|---|---|---|
| 4,355,377 A | 10/1982 | Sud et al. ................... | 365/203 |
| 6,088,270 A | 7/2000 | Hardee ........................ | 365/207 |
| 6,172,918 B1 * | 1/2001 | Hidaka ................... | 365/189.11 |
| 6,243,312 B1 * | 6/2001 | Kim ........................... | 365/203 |
| 6,278,653 B1 * | 8/2001 | Hardee ................... | 365/189.05 |

* cited by examiner

Primary Examiner—Trong Phan
(74) Attorney, Agent, or Firm—Cook, Alex, McFarron, Manzo, Cummings & Mehler, Ltd.

(57) ABSTRACT

A read data latch circuit that provides a level shift between internal and external voltages that does not require added circuitry dedicated to equalizing or level shifting the data latch nodes. Data lines are provided having a higher capacitance than the capacitance of the data latch nodes. The data latch nodes are connected to the data lines through a switch. When the switch is open, an equalization charge is shared between the data lines and the latch nodes. The voltage for providing the equalization charge and data signals internal to the chip is lower than the data output signals provided to external circuitry by the data latch.

31 Claims, 5 Drawing Sheets

DYNAMIC DATA AMPLIFIER WITH BUILT-IN VOLTAGE LEVEL SHIFTING

RELATED APPLICATION

This application claims the benefit of U.S. Provisional Application No. 60/177,548, filed Jan. 21, 2000.

BACKGROUND OF THE INVENTION

A semiconductor memory unit is a collection of storage cells together with associated circuits needed to transfer information (data) in and out of the device. Two basic types of semiconductor memories are nonvolatile, of which a ROM (read-only memory) is typical, and volatile, of which a RAM (random access memory) is typical.

In ROM, data is permanently or semi-permanently stored and can be read at any time. In a ROM in which the data are permanently stored, data is either manufactured into the device or programmed into the device and cannot be altered. In a ROM in which the data are semi-permanently stored, the data can be altered by special methods, such as by exposure to ultraviolet light or by electrical means. ROM write operations require special methods.

RAM is memory that has both read and write capabilities. RAM circuits generally come in two forms. The first form of RAM is known as a static RAM circuit ("SRAM"). A primary characteristic of an SRAM circuit is that the circuit has latches in which data may be indefinitely retained, provided power is connected to the circuit. The second form of RAM is known as a dynamic RAM circuit ("DRAM"). A primary characteristic of a DRAM circuit is that the circuit uses charge storing elements, such as capacitors, to retain the stored data in the storage locations, and the circuit must periodically refresh its data to retain it.

A conventional computer or processor has internal (or main) RAM. The computer can manipulate data only when it is in the main memory. Every program executed and file accessed must be copied from a storage device into main memory. After program or file data manipulation or utilization is complete, the RAM bits that comprise that data may be erased or overwritten by another program or file. Thus, the amount of main memory on a computer is important, as it determines how many programs can be executed at one time and how much data can be readily available to a program.

One restraint on computer memory (ROM or RAM) capacity is the physical dimensions of a disk or chip. RAM capacity is limited also by power, heat, and manufacturing limitation constraints. Because a single chip may store millions of bits of data, simplification of chip circuitry for processing bits in and out of ROM and RAM is highly desired.

The communication between a memory and its environment is achieved through data input and/or output lines, address selection lines, and control lines that specify the direction of transfer. In a conventional memory circuit, data is stored in a plurality of storage locations arranged as an array (or a group of sub-arrays) of memory cells. Each storage location is identified by an address, which might include both a row identifier and a column identifier. In conventional memory circuits, internal data lines transfer the data to the storage locations during a write cycle and transfer the data from the storage locations during a read cycle.

A simplified overview of a prior art read cycle will now be described. Three generalized components of a prior art read cycle are represented in FIG. 1. Memory cell 10 is one of the thousands or millions of storage locations within a memory 12. While each storage location may accommodate one or more bits, to simplify the present discussion, it will be assumed that memory cell 10 has only one bit. For purposes of this discussion, it may be assumed that the proper addressing and control signals have been activated for accessing the contents of memory cell 10.

As is well known by those skilled in the art, bit data processing must occur within predetermined timing specifications. The rate of bit processing not only affects the overall speed of the processor, but bits sequentially occupy the same processing components and lines. Thus, it is desirable to have fast bit data processing speeds. Typically, however, the magnitude of the charge stored for representing a bit in memory storage is too low to quickly drive output circuits. Consequently, circuitry has been incorporated into memory chips to increase the speed of data read cycles. To ameliorate the aforementioned processing speed and power constraints, read processing circuitry 14 has been incorporated in memory chips for processing bit data to external circuitry 18. Generally, such circuitry has been devised for quickly detecting the status of the bit, i.e., "0" or "1", and for responsively providing a bit status data signal that can quickly and accurately be detected by the external circuitry.

Prior art read processing circuitry 14 has included transposing the bit data as represented in the memory cell bank to a format that is more suitable for processing. One such format represents data (0 or 1) on dual data lines, A and B, as follows:

| BIT | "A" line | "B" line |
|-----|----------|----------|
| 0   | HIGH     | LOW      |
| 1   | LOW      | HIGH     |

In this example, the signals on lines A and B are processed in parallel from a data line to a latch. The latch receives the signals on lines A and B at latch inputs and responsively provides output signals on output lines A and B. The signals on the output lines are preferably driven HIGH by the system power source and driven LOW by system ground, thus providing relatively strong output signals to the external circuitry.

In the dual data line embodiment discussed above, it has long been known in the art that there are advantages to "equalizing" the data lines and latch nodes using data line equalization circuitry and latch node equalization circuitry. Equalization ensures that data lines begin at the same potential, thereby preconditioning the lines for the application of opposite (e.g., high or low) bit representation voltages. Thus, received data bit signals will be detected quickly and accurately. It has been recognized in the prior art that these and other advantages are realized by equalizing the data latch input nodes, which receive on the "A" line and the "B" line high and low data bit signals and responsively provide HIGH and LOW output signals.

In the prior art, the data latch nodes and/or the data lines are equilibrated by pre-charging both the latch nodes and the data lines to the same voltage magnitude. Typically, the latch nodes and data lines are both temporarily connected to a voltage source, such as the chip power supply. In this example, the data lines and latch nodes are charged to VCC and then isolated from the chip power supply. The equilibrated data lines ("A" and "B") receive the bit data signals, which are thereafter (in accord with processor timing specifications) provided to the equilibrated data latch nodes.

An improvement to the prior art equilibrating technique described above is disclosed in U.S. provisional patent application No. 60/185,300 (Two Phase Charge-Sharing Data Latch for Memory Circuit), filed Feb. 28, 2000, hereby incorporated herein by reference. In the data read circuit disclosed therein, the data latch nodes are equilibrated, but not through a direct connection to a power source. Rather, each latch node is equilibrated by sharing the charge of its respective pre-charged data line. Specifically, the data lines, while isolated from the latch nodes, are equilibrated to VCC as discussed above. Prior to the application of bit data on the data lines, a switch is activated so that each latch node is electrically connected to its respective data line. The capacitance of each latch node relative to its respective data line provides a charge sharing scheme through which the latch nodes are equilibrated to VCC.

In another, more sophisticated data line and latch node design, the data lines and latch nodes are pre-charged to a voltage magnitude other than VCC, referred to herein as VCCI. That is, the external voltage source magnitude and the internal voltage source magnitude are not equivalent. In this variation, VCC and VCCI are preferably generated from a voltage down converter supplied by a supply voltage VCCX. For outputting bit data, however, the latch nodes are still driven to VCC and VSS. Thus, this design includes an internal level shift between VCC and VCCI. One advantage of this design is that the equilibrated data lines do not encounter large voltage swings, such as from VCC to VSS. Rather one data line is driven from VCCI to VSS while the other data line remains at VCCI. Such a design also has the advantage of lower power consumption.

Prior art read circuits that pre-charge the latch nodes to VCCI employ a voltage source selectively connectable to the latch nodes for driving the latch nodes to VCCI. The latch power supply voltage in these prior art circuits is the same as the pre-charge voltage and an additional circuit is added between the latch outputs and the external circuits to level shift the signal voltage up to the power supply level of the external circuits. Heretofore, a data read circuit in which the data latch nodes are pre-charged to an intermediary voltage (such as VCCI) has not been designed without such a voltage source directly connected to the latch nodes or without any specific level shifting circuitry.

Thus, there is a need in the art for a memory data latch that does not require that the latch nodes be explicitly pre-charged from a voltage source and that does not require circuitry to shift the signal voltage level from an internal voltage to the voltage used by external circuitry.

SUMMARY OF THE INVENTION

The present invention provides a dynamic data amplifier latch that equalizes the latch nodes and level shifts between the memory's internal voltage and the external circuitry voltage without the addition of any additional circuitry to perform these functions. Another aspect of the present invention is that the internal data latch nodes are equalized and level shifted before a data read cycle by selectively removing their isolation from data read lines upstream in the data flow, which data read lines have been equalized and preferably pre-charged to a lower voltage than the power supply voltage for the latch. The data read lines are of a higher capacitance relative to the capacitance of the latch nodes. When a channel between the data lines and the latch nodes opens, the pre-charge is distributed through both the latch nodes and data lines. Because the capacitance of the data lines is greater than that of the latch nodes, the magnitude of the shared pre-charge does not drop significantly, equalizing the latch nodes. Upon receipt of data signals of relatively lower magnitude, the previously equalized latch subsequently amplifies and latches providing output data signals of a higher magnitude.

Preferably, a first switching device is provided for selectively connecting the data lines and data latch nodes, i.e., establishing a channel therebetween. While the switch is closed and the data lines are isolated from the data latch nodes, the data lines are pre-charged to the memory's internal operating voltage level as the latch nodes continue to latch the output data from the previous memory read cycle at the higher operating voltage of the circuitry external to the memory. At the beginning of the next read cycle, the switch opens and the latch nodes are equalized to the memory's internal power supply voltage and level shifted down from the higher power supply voltage of the circuitry external to the memory by sharing the pre-charge of the equalized data lines. In one embodiment, a pair of transistors is used for the switching device, one transistor for each latch node/data line pair.

A precharge and equalizing circuit is preferably provided and connected to the data lines for precharging and equalizing the data lines to a predetermined voltage level. Preferably, the precharge and equalizing circuit is activated while the switching device is off, thereby isolating the data lines from the latch nodes. When the precharge and equalizing circuit is deactivated and isolated from the data lines, the switching device connects each data line to its corresponding latch node. When the data bit voltage signals are later received from the data lines, a HIGH voltage signal is latched on one latch node and a LOW voltage signal is latched on the other latch node. The magnitude of the HIGH voltage signal is greater than the magnitude of the equilibration voltage.

BRIEF DESCRIPTION OF THE DRAWINGS

In describing the present invention (and prior art), reference is made to accompanying drawings wherein.

DETAILED DESCRIPTION OF THE PREFERRED EMBODIMENT

Figure 1:
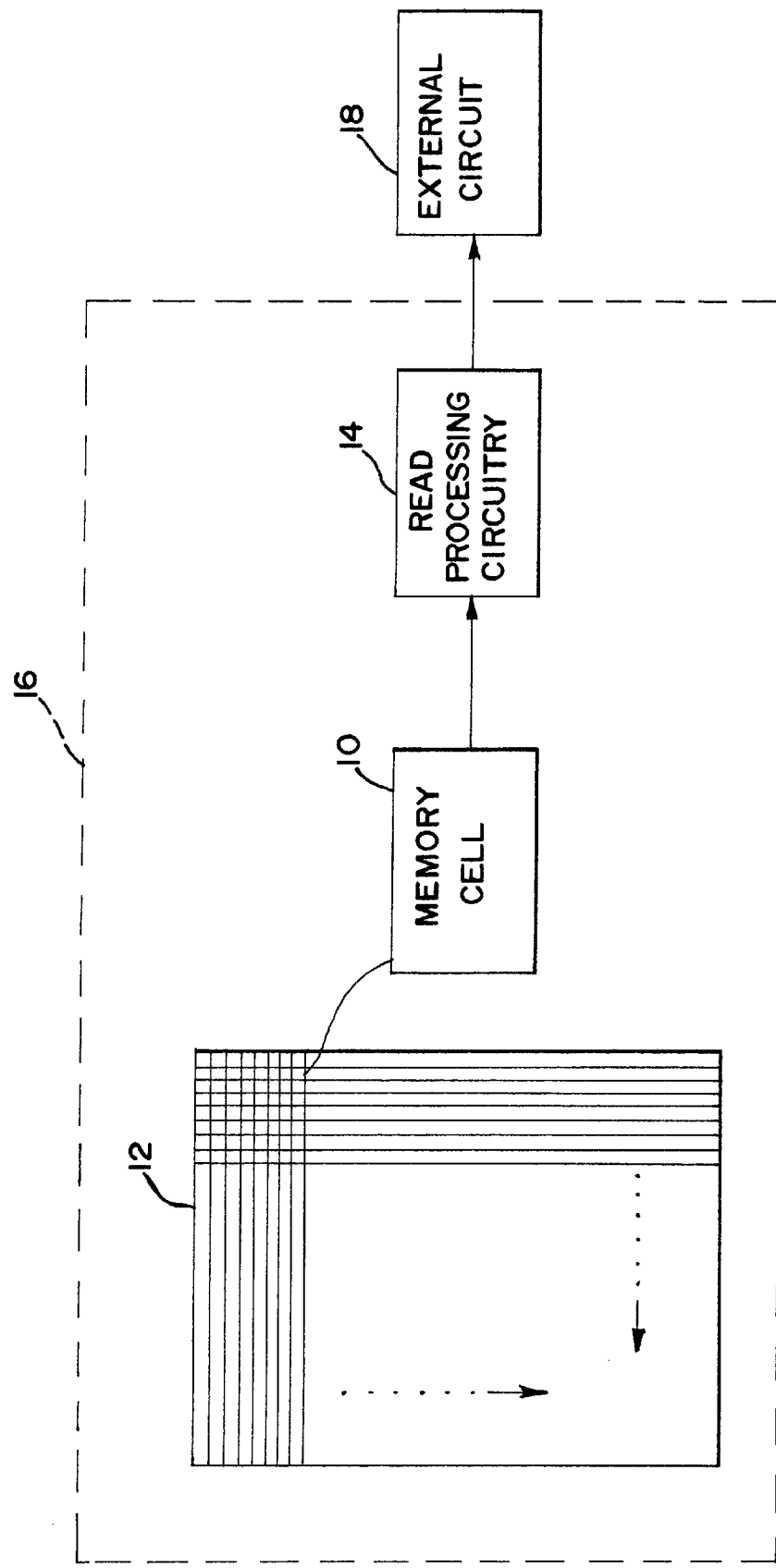
FIG. 1 is a block diagram representation of the fundamental components of a prior art read cycle.
Figure 2:
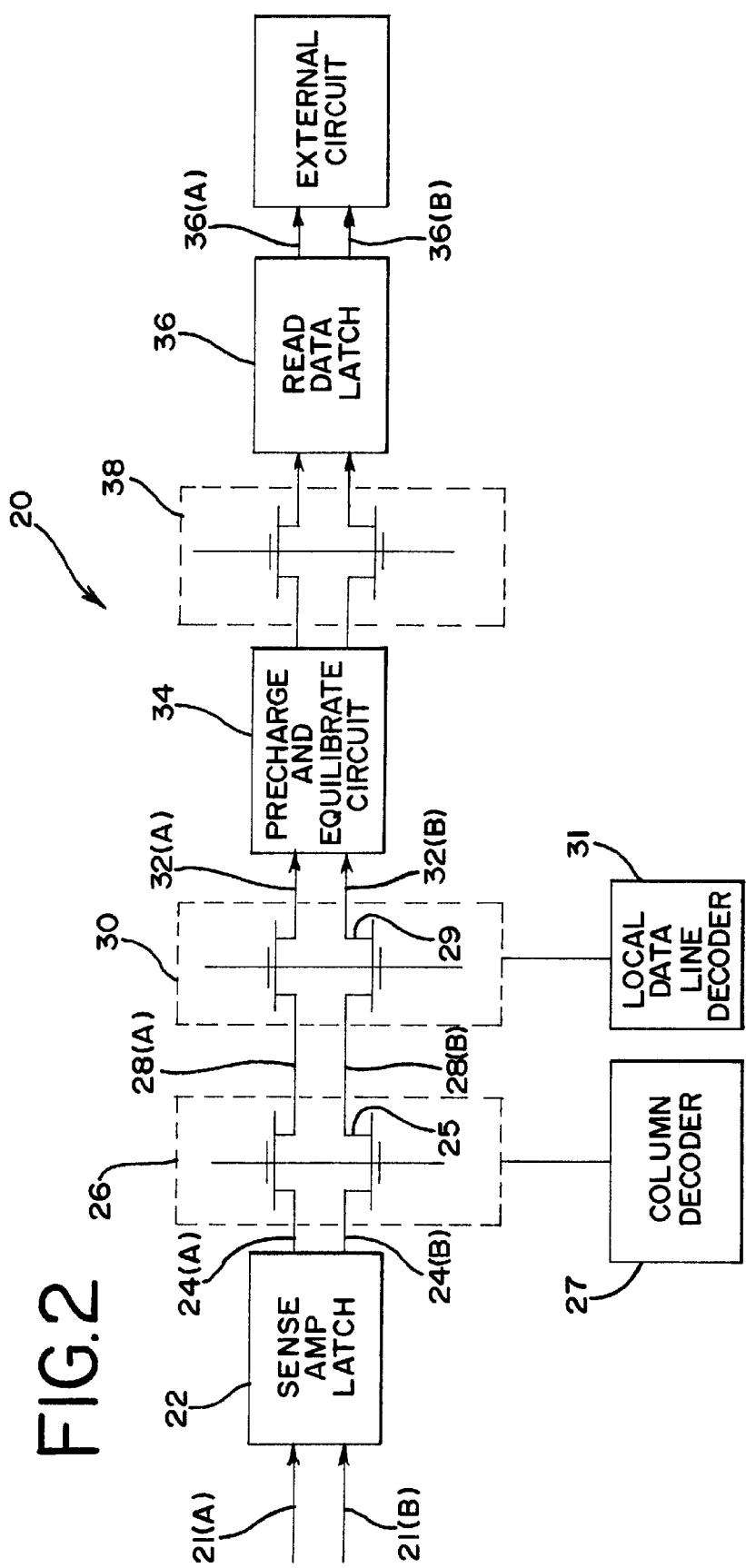
FIG. 2 is a block diagram representation of several preferred component groups for processing bit data from a memory cell bank to external circuitry.

FIG. 2 shows a block diagram of the circuit elements 20 of a system for processing bit data from a memory cell array to external circuitry. As is known in the art, there may be millions of memory cells within a memory (not shown). Bit data ("0" or "1") is provided from a memory cell to bit lines 21(A) and 21(B) of the memory array. The bit data is sensed and amplified by a sense amp latch 22 and transposed therein to dual outputs 24(A) and 24(B). The signals on the dual outputs are representative of the bit data ("0" or "1") in the manner discussed above, namely, a "high" voltage is applied to one output and a "low" voltage is applied to the other output to represent a "0" bit, and the opposite of such voltages are applied to outputs 24(A) and 24(B) to represent a "1" bit.

The output of the sense amp latch 22 is connected to a local data line pair 28(A) and 28(B) through a column select circuit 26 having a plurality of column select switches therein. The column select circuit 26 operates under control of a column decoder circuit 27. The column decoder circuit 27 selectively connects one of a number of sense amps to one local data line pair, shown as 28(A) and 28(B), via a column select switch 23. Thus, the bit data on data lines "A" and "B" are processed through the column select circuit 26 to local read data line pair 28(A) and 28(B). Preferably, multiple column select switches are connected to the local data bus so that a number of sense amps can share the same local data line pair. The column decoder 27 activates the particular column select switch based on column address information provided from an external source, as is known in the art.

A plurality of local data fine pairs, including local data line pair 28(A) and 28(B), are connected to a local data fine select circuit 30. The local data line select circuit 30 operates under control of a local data line decoder 31 for connecting one pair of local read lines to one of a plurality of global data line pairs through a selected data line switch 29. The local data line decoder 31 selects the particular local data fine switch based on address information provided externally, as is known in the art. The data line switch 29 connects local data line pair 28(A) and 28(B) to global data line pair 32(A) and 32(B). Preferably, a plurality of global data line pairs are collected together to form a global data bus. Multiple local data line switches are connected to each global data line pair so that a number of local data fines can share the same global data line. The voltage levels on the global data line representing a "0" bit and a "1" bit are essentially equal to the voltages on the respective local data fines. The differential voltage between the data lines is typically very small, e.g., 0.1 volt. Through this hierarchy of sense amplifiers, local data lines, and global data lines, many individual memory cells, each with a unique address, share the same global data line pair.

Referring still to FIG. 2, the global data line pair 32(A) and 32(B) is connected to a precharge and equilibrate circuit 34, which, in turn, is connected to a data read latch 36 through a data latch isolation circuit 38. The bit data received by read data latch 36 is latched HIGH and LOW on data bit output nodes 36(A) and 36(B) and available for output and subsequent processing by circuit elements, typically positioned external to the memory circuit.

As is known in the art, DRAMS have an active phase (data is being read or written) and an inactive phase (internal circuits are being pre-charged). As shown in FIG. 2, the pre-charge and equilibration circuit is connected to the global data line pair 32(A) and 32(B). During the pre-charge phase, this circuit pre-charges and equilibrates the global data lines, including global data lines 32(A) and 32(B), and the local data lines, including local data lines 28(A) and 28(B) (the local data line switches are all turned on during this phase), in preparation for a read or write operation. During the read phase, the pre-charge and equilibration circuit is turned off and all local data line switches, except the selected local data line switch, are turned off and the "read" signal is developed on the local and global data lines as previously described.

Local read data lines 28(A) and 28(B) are thus precharged, via local data line select circuit 30 and a global data line pair, by pre-charge and equilibrate circuit 34. Local data line select circuit 30 electrically isolates the global read data lines from the local data lines, except for when a read operation or pre-charge operation is occurring. While such read operation is occurring, a data line switch connects a global data line pair to a selected local data line pair.

Details of the preferred embodiment of the sense amp latch, column select and column decoder circuits, and the local data line select and data line decoder circuits are well known in the art.

During the pre-charge phase, the read data latch 36 is disconnected from the global data lines by the data latch switch 38, while the data from the previous read cycle is stored in the latch and transmitted to the circuits external to the memory. As discussed above, in the embodiments of the present invention, the power supply for the external circuits (VCC) is higher than the internal memory array circuitry power supply (VCCI). Thus, a level shifting function is required for providing the bit data to the external circuitry. In the preferred embodiment of this invention, the level shifting function is incorporated as part of the data sensing and amplification function of the data read latch with a minimum of additional circuitry.

The pre-charge and equilibration circuitry 34, the data latch switch 38, and the read data latch circuit 36 of the preferred embodiment will now be described with reference to FIG. 3.

Transistors 40 and 42 function as switches for controllably isolating the read data latch 36 from the circuitry upstream. Transistors 44, 46, and 48 implement the precharge and equilibration circuit 34 and transistors 94, 102, 104, 106, 108, and 112 implement the read data latch circuit and the level shift circuit combined.

Transistors 40 and 42 operate under the control of a first latch control line 90. When latch control line 90 is HIGH, pass transistors 40 and 42 (shown in FIG. 3 as PMOS devices) isolate the data latch 36 from the data lines 32(A) and 32(B). When latch control line 90 is LOW, the data latch 36 receives the data bit signal from data lines 32(A) and 32(B).

A second latch control line 92 controls switch transistor 94, shown as a PMOS device, for The application of the voltage source 96 (VCC) to the flip-flop for latching data. As shown, control line 92 is connected to the gate electrode of FET 94. A Vss or ground potential is also provided to the flop-flop. First latch control line 90 controls switch transistor 112, shown as an NMOS device, for the application of the voltage potential at 110(ground) to the flip-flop.

When second latch control line 92 is LOW, and first latch control line 90 is HIGH, PMOS FET 94 is on, NMOS FET 112 is on, and PMOS FETs 40 and 42 are off. In this state, latch 36 holds the data from the previous read cycle and the latch nodes are driven HIGH by VCC and LOW by ground. Also, the global data lines and the local data lines are pre-charged to the internal voltage supply level (VCCI), as described below. In this state the latch 36 is isolated from the data lines 32(A) and 32(B).

The Precharge Phase

In the pre-charge phase described above, the read data latch/level shift circuit is thus isolated from the global data lines 32(A) and 32(B), and the latch circuit is enabled so that data from the previous read cycle is held in the latch. During this phase, equilibration control line 98 is low, so that the PMOS transistors 44, 46, and 48 are conductive. Hence, the global data lines are pre-charged and equilibrated to the internal power supply level, VCCI, by transistors 44, 46, and 48. Also during this phase, one node of the latch is at the external power supply voltage, VCC, and the other node is at ground.

The First Stage Level Shift and Latch Equilibrate Phase

At the beginning of the next stage in a data read cycle, the latch control line 92 goes HIGH and latch control signal 90 goes LOW. FETs 94 and 112 turn off and FETs 40 and 42 turn on. The source regions of transistors 102 and 104 are thus isolated from VCC, the source regions of transistors 106 and 108 are thus isolated from ground, and the gate electrodes of these transistors (latch nodes 36(A) and 36(B)) are thus connected to the data line nodes 32(A) and 32(B) respectively. In this state, both latch nodes will be driven to a voltage very near the pre-charged level of nodes 32(A) and 32(B) through charge sharing.

As charge is shared between the data latch 36 and the equilibrated data lines (which are at VCCI), both latch nodes quickly move to very near the equilibrated data line charge state (VCCI) because the capacitance on the global data lines is much higher than the capacitance on the latch nodes. At this point, the data latch nodes 36(A) and 36(B) are ready to detect the differential voltage received by the data lines 32(A) and 32(B), i.e., one of the data lines will be pulled low, as the other line remains high.

The latch nodes have thus been equalized to prepare the latch to sense and amplify the very small differential voltage that will be developed on the global data lines as previously described. In addition, the first stage of the level shifting function has been performed since the latch nodes are now at VCCI. The small differential voltage that develops on the global data lines as previously described is passed to the latch nodes through the on transistors 40 and 42.

The Second Stage Level Shift and Sensed Signal Latching Phase

After sufficient time has elapsed to develop an adequate differential signal on the latch nodes, control signal 90 goes HIGH and control signal 92 goes LOW, turning off transistors 40 and 42 to isolate the latch from the global data lines and turning on transistors 94 and 112 to enable the latch. As the latch is enabled, the differential voltage between the two latch nodes causes the latch flip-flop to set in the state determined by the data read from the memory cell. One latch node will move to ground while the other node moves to the external circuitry power supply voltage VCC. The data sensing and level shifting functions are thus completed since a full amplitude data bit is stored in the latch (one side at VCC and the other at ground) and the high signal level has been shifted from VCCI to VCC.

The equilibration components 34 of the circuit of FIG. 3 will now be discussed in detail. Equilibration control line 98 controls pre-charge and equalizing circuit 34, which includes PMOS transistors. When control line 98 is LOW, data lines 32(A) and 32(B) are both driven to VCCI and equilibrated. When control line 98 is HIGH, the data lines are isolated from each other and from voltage source VCCI. Equilibration control signal 98 is identical to latch control signal 92 during a read cycle, meaning it goes HIGH or LOW at the same time latch control signal 92 goes HIGH or LOW. The circuitry for providing the control signals 90, 92, and 98 in the proper state at the proper time is typical of the type conventionally used for producing timing and control signals for DRAMs, for example, and is well known in the art.

One aspect of P-channel transistor 94 in this embodiment is to prevent current (charge) from the VCC driving source 96 from flowing onto the data lines through P-channel transistors 94, 102/40, and 104/42 when the latch nodes are equilibrated and level shifted to the VCCI level, which is lower than VCC. Such current flow would not be equal into the two latch nodes during the time the nodes are equilibrating to VCCI because either transistor 102 or 104 would be on at the beginning of the pre-charge while the other would be off depending on information previously stored in the latch. This difference in current would result in some differential voltage on the nodes that could be opposite in polarity to the signal to be developed during the read operation thus requiring more signal to be developed.

Figure 3:
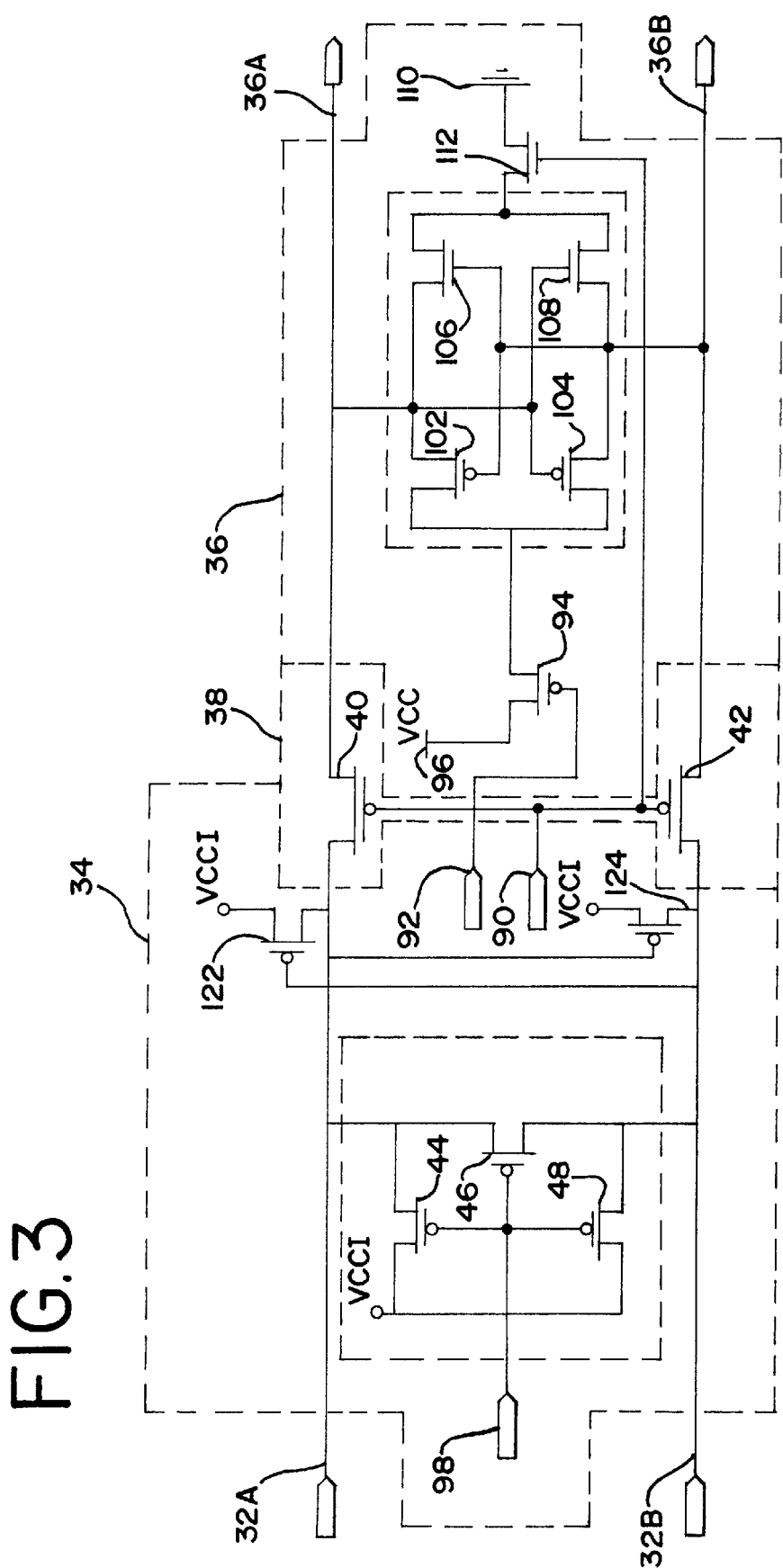
FIG. 3 is a schematic diagram of one embodiment of the data read latch of FIG. 2, in accordance with the present invention.

Transistors 122 and 124 shown in FIG. 3 serve to ensure that the data line that is to remain HIGH during a read or write operation will remain HIGH. The LOW going signal on the other line will turn on its respective transistor connected to the line that should remain HIGH and connect it to VCCI (i.e., 32(A) turns on 124 or 32(B) turns on 122). Each transistor has its drain connected to the equalizing voltage source (VCCI), its source connected to a respective one data line, and its gate connected to the other data line. During a read or write cycle, the high data line will be held to VCCI, stablilizing the line. It would be undersirable to have the high line go below VCCI during a read or write cycle operation because the data being written or read could be corrupted.

Figure 4:
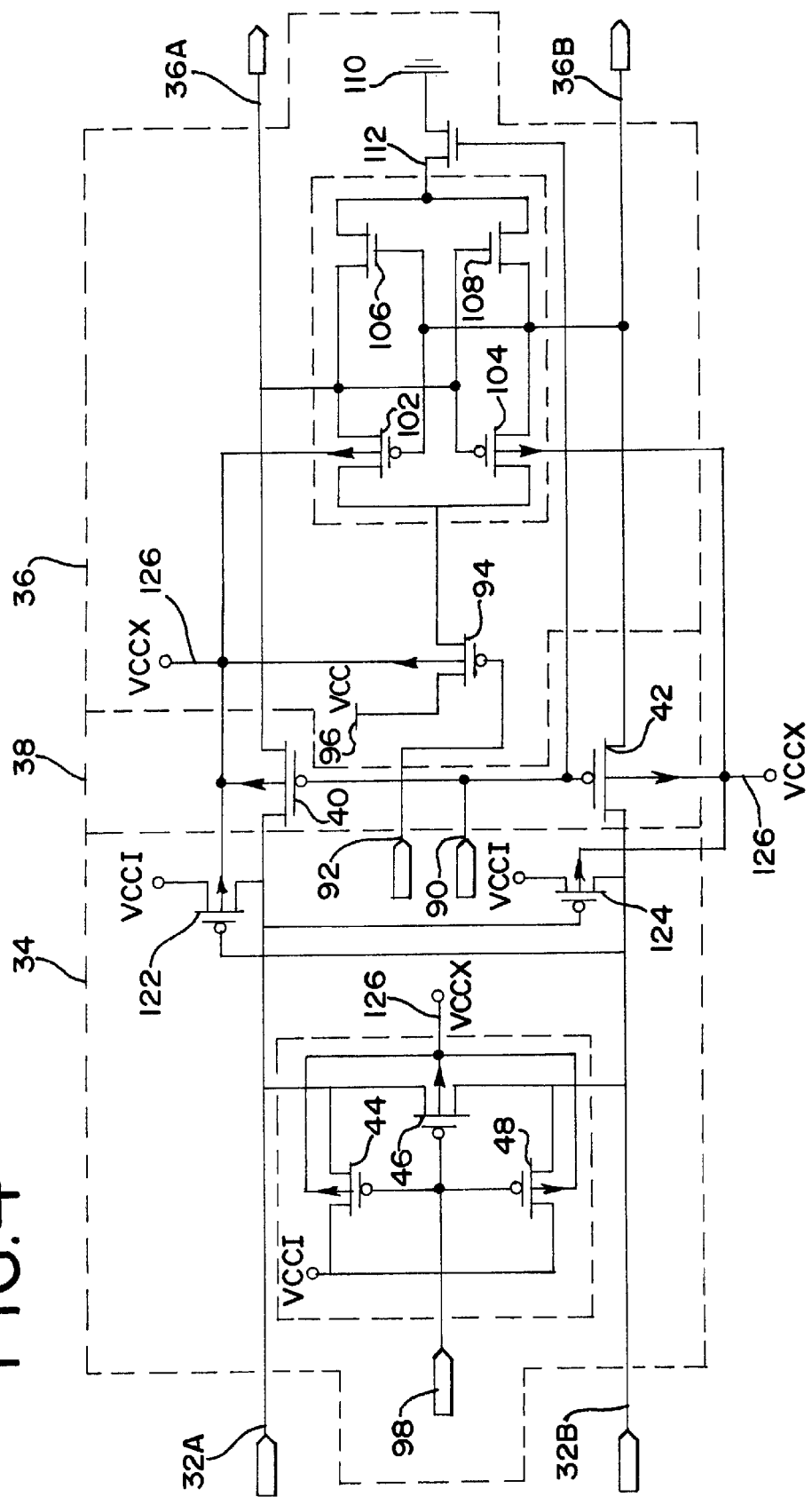
FIG. 4 is a schematic diagram of a second embodiment of the data read latch of FIG. 2, in accordance with the present invention.

FIG. 4 is an illustration of an embodiment in which the supply voltage (VCC) 96 and the lower supply voltage (VCCI) are generated from an external supply voltage (VCCX) 126 as shown VCC and VCCI are preferably generated from a voltage down converter supplied by supply voltage VCCX. In the case of FIG. 4, the n-wells are implicitly tied to VCC, the highest voltage available and VCC must be applied before VCCI is applied.

In this embodiment, preferably the n-wells of the p-type devices are tied to VCCX, as illustrated, to prevent latch-up since either VCC or VCCI may rise first on the data lines or latch nodes. In this regard, biasing the n-well to VCC may be dangerous because one of the p-channel source-drain junctions may forward bias, inducing latch-up.

Figure 5:
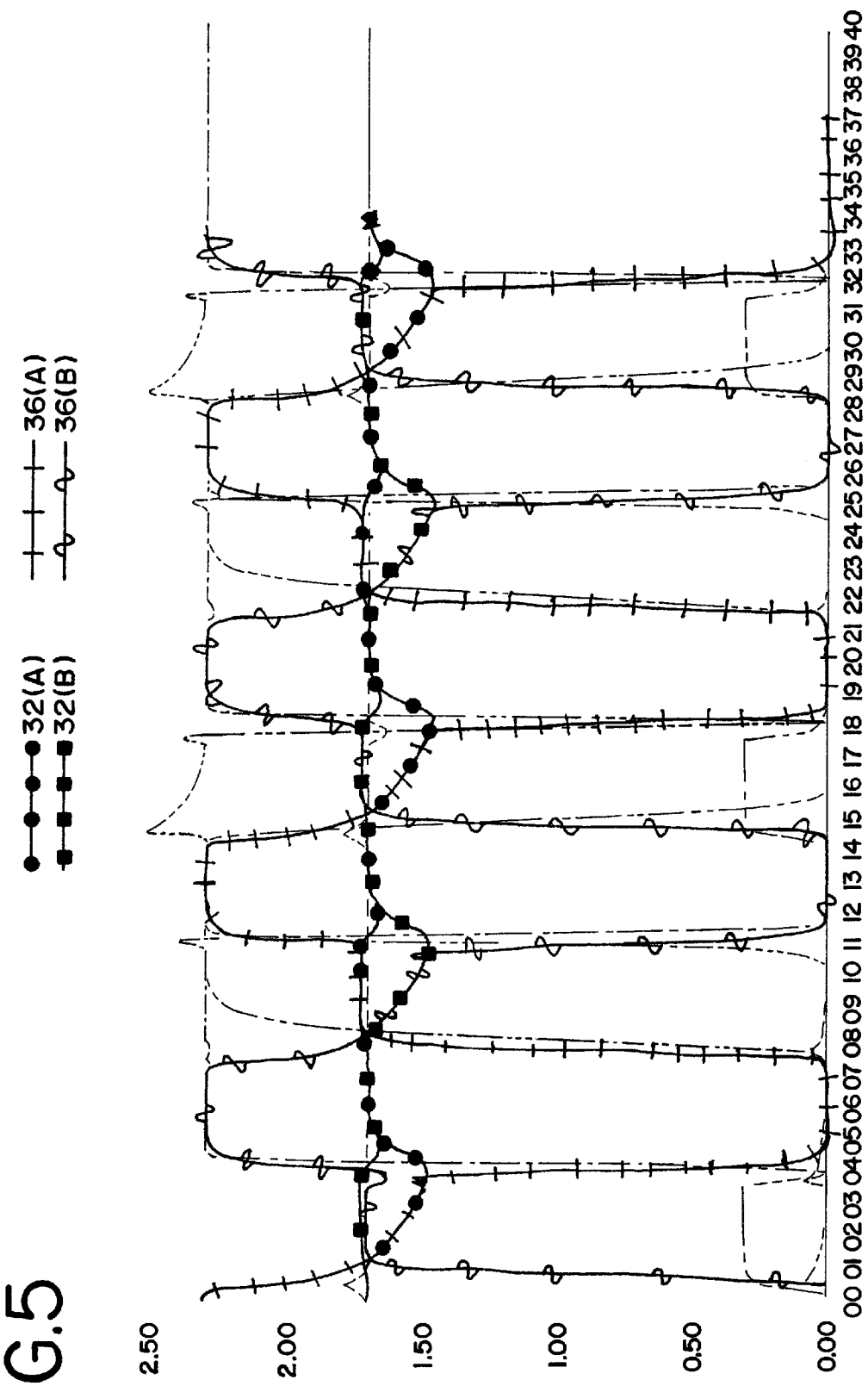
FIG. 5 is a diagram showing the voltage magnitudes of the data lines and latch nodes through several read cycles of the data read latch of FIG. 4.

FIG. 5 is a diagram showing voltage levels at data lines 32(A) and 32(B) and latch nodes 36(A) and 36(B), as generated by a SPICE circuit analysis program simulation of the circuit of FIG. 4. In this example, VSS=0.0V, VCC= 2.3V, and VCCI=1.7 V. The duration of the simulation was 40 ns. The diagram shows the voltages at said data lines and latch nodes throughout consecutive read cycles, but particular attention should be drawn to the following three waveform segments:

(1) data lines are isolated from latch nodes as the data lines are equalized and the latch nodes hold output data driven by VCC and VSS;

(2) after the latch holding period has terminated and the pass transistors open to equalize the latch nodes; and (3) bit data is received by the data lines and latch nodes.

Referring to FIG. 5, at about 6 ns, it can be seen that the data lines 32(A) and 32(B) are equalized at about VCCI (1.7 V), while the latch is holding the output data on the latch nodes. As indicated, one latch node 36(A) is at VSS and the other latch node 36(B) is at VCC.

From about 7 ns to 8.25 ns, the latch node voltages converge to VCCI, which corresponds to the removal of VSS and VCC power supply voltages from the latch nodes and switching pass transistors 40 and 42 on (conductive), equalizing the data latch nodes.

Just after 8.25 ns, data line 32(A) and latch node 36(A) maintain VCCI, while data line 32(B) and latch node 36(B)

decline, indicating that data line 32(B) has received a low memory bit data signal from the sense amplifier latch and data line 32(A) has received a high memory bit data signal from the sense amplifier latch. At about 10.5 ns, the latch nodes are driven to VCC and VSS, while the data lines converge again to VCCI, indicating that control line 92 has turned transistor 94 ON, for supplying the latch with VCC, and control line 90 has turned pass transistors 40 and 42 OFF and VSS supply transistor 112 ON, for supplying the latch with VSS. In this example, latch node 36(A) is driven to VCC and latch node 36(B) is driven to VSS.

Thus, FIG. 5 shows that for the circuit of FIG. 4, while the data lines 32(A) and 32(B) always operate between VCCI and the memory read signal level, the latch nodes 36(A) and 36(B) operate between VCC and VSS during a latch hold period and between VCCI and the memory read signal level during the memory signal sensing period. This operation of the latch at the VCCI level during the read operation and at VCC during the 'data holding' operation demonstrates the built in level shifting function of this invention.

It is to be understood that the above-described embodiments are merely illustrative of the principle of the invention and that many variations may be devised by those skilled in the art without departing for the scope of the invention. For example, PMOS or NMOS or other transistor types may be substituted for those shown. It is, therefore, intended that such and other variations be included within the scope of the claims.

What is claimed is:

1. In a data memory circuit, a method for level shifting first and second bit data signals for output on first and second latch nodes of a latching circuit having a first and second capacitance, respectively, comprising:

providing a first data line, having a greater capacitance than said first capacitance, for selective connection to the first latch node;

providing a second data line, having a greater capacitance than said second capacitance, for selective connection to the second latch node;

isolating the first and second data lines from the respective first and second latch nodes;

selectively connecting said latching circuit to first and second voltage sources, said first voltage being of magnitude being greater than the magnitude of said second voltage;

equalizing said first and second data lines to a third voltage magnitude, said third voltage being less than said first voltage magnitude and greater than said second voltage;

disconnecting said latching circuit from said first and second voltage sources;

connecting said first and second latch nodes to said first and second data lines, respectively; and providing said first and second bit data signals to said first and second latch nodes, and disconnecting said first and second latch nodes from said first and second data lines, and connecting said latch to said first and second voltage sources and driving one of said first and second latch nodes to said first voltage magnitude greater than said third voltage magnitude and driving the other of said first and second latch nodes to a second voltage magnitude less than said third voltage magnitude, based upon the relative magnitudes of said first and second bit data signals.

2. A dynamic data amplifier having a built-in voltage level shifter for a data latch receiving bit data signals, comprising:

at least a first data line having a first capacitance and charged to an equalized voltage level;

a latching circuit having a first data latch node having a first node capacitance that is less than said first capacitance;

a first switching device for selectively connecting and disconnecting said first data line to said first data latch node for charging said first latch node to approximately said equalized voltage level and for isolating the data latch from said first data line;

a first voltage supply for driving said first data latch node to a voltage magnitude greater than said equalized voltage level based upon said received bit data signals; and a second switching device for selectively connecting and disconnecting said latching circuit from said first voltage supply.

3. The data amplifier of claim 2 further comprising:

a second data line having a second capacitance that is approximately equal to said first capacitance and charged to approximately said equalized voltage level;

said latching circuit having a second data latch node having a second node capacitance that is less than said second capacitance;

a third switching device for selectively connecting and disconnecting said second data line to said second data latch node for charging said second latch node to approximately said equalized voltage level and for isolating the data latch from said first data line;

a second voltage supply for driving said second data latch node to a voltage magnitude less than said equalized voltage level based upon said received bit data signals; and a fourth switching device for selectively connecting and disconnecting said latching circuit from said second voltage supply.

4. The data amplifier of claim 3 wherein said first, second, third, and fourth switching devices comprise first, second, third, and fourth transistors, respectively.

5. The data amplifier of claim 4 further comprising:

a precharge and equalizing circuit connected to said first data line and said second data line;

a data latch circuit connected to said first and second latch nodes; and wherein said data amplifier has a first mode of operation wherein said precharge and equalizing circuit is activated for precharging and equalizing said first and second data lines to a first equalizing voltage level as said first and second transistors are deactivated for isolating said first and second data lines from said first and second latch nodes and said second and fourth transistors are activated and connect said latch to said first and second voltage sources;

a second mode of operation wherein said precharge and equalizing circuit is deactivated and said second and fourth transistors are deactivated for disconnecting said latch from said first and second voltage sources, and said first and third transistors are activated for connecting said first data line to said first latch node and connecting said second data line to said second latch node for equalizing said first and second latch nodes to approximately said first equalizing voltage; and a third mode of operation wherein said first and third transistors are deactivated for disconnecting said first and second data latch nodes from said first and second data lines; said second and fourth transistors are activated for connecting said first and second voltage sources to said latch; latching a HIGH voltage signal on one of said first and second latch nodes and a LOW voltage signal on the other one of said first and second data latch nodes in response to receiving from said first and second data lines first and second data bit voltages signals, wherein said HIGH voltage signal is greater than said equalizing voltage level.

6. The data amplifier of claim 5 wherein said HIGH voltage signal is greater than both first and second data bit voltage signals.

7. The data amplifier of claim 3 further comprising an external voltage source having a magnitude greater than the magnitude of said first voltage supply and wherein said first and second switching devices and voltage pull-up devices of said latch nodes comprise a plurality of p-channel transistors having the n-wells tied to said external voltage supply.

8. A data latch circuit for providing an output signal representative of a bit of memory, said circuit comprising:
 a pre-charge circuit having a voltage source of a first voltage magnitude selectively connectable to first and second data lines each of an approximate first capacitance;
 a latch having first and second latch nodes each of an approximate second capacitance that is less than said first capacitance, said latch being selectively connected to a second voltage source having a magnitude greater than the magnitude of said first voltage source and being selectively connected to a third voltage source having a magnitude less than said first voltage magnitude for driving one of said latch nodes to a voltage higher than said first voltage magnitude and the other one of said latch nodes to a voltage less than said first voltage magnitude,
 a first switch circuit for selectively connecting said first and second data lines to said first and second latch nodes, respectively; and
 a second switch circuit for selectively connecting said latch to said second and third voltage sources.

9. The data latch circuit of claim 8 further comprising:
 first and second data bit signals representative of said bit of memory; and
 wherein said latch responsively drives said first and second latch nodes to said second and third magnitudes based upon the relative magnitudes of said first and second data bit signals.

10. In a semiconductor memory having a plurality of memory cells, a data read method including the steps of coupling, via a sense amplifier, local read data lines, and a pair of global data read lines, data signals representing stored data from a selected memory cell to a data read latch having a power supply voltage of magnitude greater than a memory supply voltage magnitude at which the sense amplifier, local, and global data read lines operate, and latching for output on a data latch node a HIGH voltage signal of a magnitude greater than a semiconductor memory supply voltage magnitude, the improvement comprising:
 before said data signals are coupled to said data read latch, equalizing said pair of global data read lines by operating an equalizing transistor having a path of controllable conductivity coupled therebetween and a path of controllable conductivity coupled to said memory supply voltage,
 isolating said data read latch circuit from its power supply and ground connections and connecting the data latch nodes of said latch circuit to said pair of global data read lines for receiving said data signals and for shifting the common mode level of said data latch nodes to the memory supply voltage level;
 equalizing and level shifting data latch nodes in the data read latch by operating first and second pass transistors each having a path of controllable conductivity coupled between a said global data read line and a corresponding data latch node,
 wherein the capacitance of each said data latch node is smaller than the capacitance of each corresponding global read line.

11. The method of claim 10, comprising:
 driving said global data read lines to a first equalizing voltage when a path of conductivity is established between said global data read lines; and
 after equalizing said data latch nodes and receiving bit data signals from global data lines on said latch nodes and subsequently isolating said data latch nodes from said global data lines, driving one of said data latch nodes to said HIGH voltage signal greater than said first equalizing voltage and driving the other of said data latch nodes to a third voltage, substantially less than said first equalizing voltage.

12. In a semiconductor memory having a supply voltage of a first magnitude, a plurality of memory cells, a sense amplifier, local read data lines, a pair of global data read lines, a data read latch coupled selectively to said global data read lines, said data read latch having a pair of latch nodes, the semiconductor memory also receiving a second voltage, said second voltage being associated with the data read latch, wherein the second voltage has a second magnitude greater than said first magnitude, the method comprising:
 level shifting and equalizing voltages at said latch nodes of said data read latch to said first voltage magnitude by charge sharing between said latch nodes and said data read lines,
 said data read lines having previously been precharged and equalized to said first voltage magnitude.

13. The method of claim 12 wherein said memory includes a plurality of p-channel transistors, the method further comprising:
 receiving an external voltage having a magnitude greater than the magnitude of said first and second voltage source magnitudes; and
 coupling the n-wells of all of said p-channel transistors which are coupled to said data lines and said latch nodes to said external voltage.

14. The method of claim 12 wherein each of said first and second data latch nodes has a smaller capacitance than the capacitance of their respective global data read lines.

15. The method of claim 12 further including the step of selectively isolating said first and second data latch nodes from their respective global data read lines.

16. A semiconductor memory, comprising:
 first and second global data lines for processing in parallel first and second data signals representative of bit data;
 a pre-charge and equilibrate circuit coupled to said first and second global data lines;
 first and second isolation switches for controllably connecting said first and second global data lines to a data latch having first and second data latch nodes;
 a first voltage source of a first magnitude for selectively pre-charging both global data lines;

a second voltage source for driving one of said data latch nodes to a second magnitude greater than said first magnitude, based upon said first and second data signals; and third and fourth isolation switches for controllably connecting said data latch to said second voltage source and ground.

17. The semiconductor memory of claim 16 further comprising:

an external voltage source and a down converter for generating said first and second voltage sources; and wherein said data latch includes pull-up devices, wherein said pull-up devices, said pre-charge and equilibrate circuit, and said first and second isolation switches comprise p-channel transistors having n-wells tied to said external voltage source.

18. In a data memory circuit of the type having a first and second global data lines, a precharge and equalizing circuit coupled to the global data lines, a data read latch containing first and second latch nodes, first and second power supply voltages associated with the data read latch, and an intermediate power supply voltage which is intermediate in magnitude between the first and second power supply voltages and is associated with the precharge and equalizing circuit, the method comprising the steps of:

in a first step, isolating said first and second latch nodes from said global data lines, and during said isolating, precharging and equalizing said global data lines to said intermediate voltage;

in a second step, level shifting the first and second latch nodes by selectively coupling said precharged and equalized global data lines thereto, while disconnecting said first and second power supply voltages from said data read latch; and in a third step, applying data from a memory cell to at least one of the precharged and equalized global data lines, to develop a voltage differential on said global data lines and on said latch nodes, and then latching said data read latch by selectively applying said first and second power supply voltages to said data read latch while isolating said global data lines from said data read lines, thereby driving said first and second latch nodes to said first and second power supply voltages.

19. The method according to claim 18 wherein said first step further includes driving said latch nodes to said first and second power supply voltages by latching previously-sensed data read from a memory cell, whereby the latch nodes are alternately level shifted to said intermediate voltage and then driven to said first and second power supply voltages.

20. The method of claim 18 wherein said first step includes applying a first control signal to a first control line to operate a data latch isolation circuit connected between the data read latch and the global data read lines, so that said latch is isolated from said global data read lines.

21. The method of claim 20 wherein said first step further includes applying a second control signal to a second control line which is coupled to a control electrode of a first switch between the data read latch and a first one of said power supply voltages.

22. The method of claim 21 wherein said first step includes applying said first control signal to a second switch between the data read latch and second one of said power supply voltages.

23. The method of claim 22 wherein said data latch isolation circuit comprises first and second p-channel transistors and wherein said first control signal is a HIGH signal applied to gate electrodes thereof;

wherein said first switch comprises a p-channel transistor coupled between said first power supply voltage and said latch, and wherein said second control signal is a LOW signal applied to the gate electrode thereof; and wherein said second switch comprises an n-channel transistor coupled between said second power supply voltage and said latch, and wherein said first control signal is applied to the gate electrode thereof.

24. The method of claim 20 wherein said second step includes applying a signal to said first control line so that the data latch is coupled to said global data read lines.

25. The method of claim 24 wherein said second step further includes applying a signal to said second control line so that said first switch is turned to an off state.

26. The method of claim 23 wherein said second step includes:

applying a LOW signal to said first control line, thereby to permit charge-sharing between said global data lines and the latch nodes via the first and second p-channel transistors of said data isolation circuit, and thereby also to turn off said second switch between said second power supply voltage and said latch; and applying a HIGH signal to said second control line, thereby to turn off said first switch and disconnect said latch from said first power supply voltage.

27. The method of claim 26 wherein said third step includes applying a HIGH signal to said first control line and a LOW signal to said second control line.

28. The method of claim 23 further including coupling n-wells of said p-channel transistors to an external voltage to prevent latch-up.

29. The method of claim 28 including generating said intermediate voltage from said external voltage.

30. In a data memory circuit of the type having a first and second global data lines, a precharge and equalizing circuit coupled to the global data lines, a data read latch containing first and second latch nodes, first and second power supply voltages associated with the data read latch, and an intermediate power supply voltage which is intermediate in magnitude between the first and second power supply voltages and is associated with the precharge and equalizing circuit, the method comprising the steps of:

isolating said first and second latch nodes from said first and second power supply voltages;

selectively coupling said first and second latch nodes to global data lines which have been precharged and equalized to said intermediate voltage, thereby to level shift the latch nodes substantially to said intermediate voltage; and then coupling said latch to said first and second power supply voltages and driving said latch nodes in accordance with a differential voltage developed on said global data line based on a memory cell.

31. The method of claim 20 wherein said coupling and driving step includes selectively isolating the global data lines from the latch nodes after the differential voltage has been coupled to the latch nodes.

* * * * *